US008791432B2

(12) United States Patent
Matsumoto

(10) Patent No.: US 8,791,432 B2
(45) Date of Patent: Jul. 29, 2014

(54) CHARGED PARTICLE BEAM WRITING APPARATUS AND CHARGED PARTICLE BEAM WRITING METHOD

(75) Inventor: Hironobu Matsumoto, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 77 days.

(21) Appl. No.: 13/089,814

(22) Filed: Apr. 19, 2011

(65) Prior Publication Data

US 2011/0253912 A1 Oct. 20, 2011

(30) Foreign Application Priority Data

Apr. 20, 2010 (JP) ................................ 2010-097295

(51) Int. Cl.
*G21K 5/10* (2006.01)
*B82Y 40/00* (2011.01)
*B82Y 10/00* (2011.01)
*H01J 37/317* (2006.01)
*H01J 37/302* (2006.01)

(52) U.S. Cl.
CPC ............ *H01J 37/3174* (2013.01); *B82Y 40/00* (2013.01); *B82Y 10/00* (2013.01); *H01J 37/3026* (2013.01)
USPC ................. 250/492.22; 250/492.1; 250/492.2; 250/492.3

(58) Field of Classification Search
CPC ................... H01J 37/3174; H01J 2237/31764; H01J 2237/2817; H01J 2237/31703; H01J 2237/31723; G03F 7/70441
USPC ................. 250/492.1, 492.2, 492.21, 492.22, 250/492.23, 492.3
See application file for complete search history.

(56) References Cited

U.S. PATENT DOCUMENTS

2008/0206654 A1* 8/2008 Abe ................................... 430/5
2010/0127185 A1* 5/2010 Fragner et al. ................ 250/398

FOREIGN PATENT DOCUMENTS

| JP | 59-208720 | 11/1984 |
| JP | 2-298019 | 12/1990 |
| JP | 3469422 | 9/2003 |
| JP | 2007-150243 | 6/2007 |

OTHER PUBLICATIONS

U.S. Appl. No. 13/253,382, filed Oct. 5, 2011, Matsumoto.
Japanese Office Action issued Jan. 7, 2014, in Japan Patent Application No. 2010-097295 (with English translation).
U.S. Appl. No. 13/961,101, filed Aug. 7, 2013, Matsumoto.
Takayuki Abe, et al., "High-Accuracy Proximity Effect Correction for Mask Writing", Japanese Journal of Applied Physics, vol. 46, No. 2, 2007, pp. 826-833.

\* cited by examiner

*Primary Examiner* — Nicole Ippolito
*Assistant Examiner* — Hanway Chang
(74) *Attorney, Agent, or Firm* — Oblon, Spivak, McClelland, Maier & Neustadt, L.L.P.

(57) ABSTRACT

A beam writing apparatus according to an embodiment includes a selection unit configured to select a dose equation from a plurality of dose equations for calculating a dose of a beam, for each small region of a plurality of small regions made by virtually dividing a writing region of a target workpiece into mesh-like regions, a dose calculation unit configured to calculate a dose of a beam which is shot into a small region of the plurality of small regions, by using a selected dose equation, for the each small region, and a writing unit configured to write a desired pattern in the small region, by using a calculated dose, for the each small region.

11 Claims, 12 Drawing Sheets

CHARGED PARTICLE BEAM WRITING APPARATUS AND CHARGED PARTICLE BEAM WRITING METHOD

CROSS-REFERENCE TO RELATED APPLICATION

This application is based upon and claims the benefit of priority from prior Japanese Patent Application No. 2010-097295 filed on Apr. 20, 2010 in Japan, the entire contents of which are incorporated herein by reference.

BACKGROUND OF THE INVENTION

1. Field of the Invention

Embodiments of the present invention relate to a charged particle beam writing apparatus and a charged particle beam writing method. For example, they relate to a method for obtaining a dose of electron beam radiation in the electron beam writing.

2. Related Art

The microlithography technique which advances micro-miniaturization of semiconductor devices is extremely important as being a unique process whereby patterns are formed in the semiconductor manufacturing. In recent years, with high integration of LSI, the line width (critical dimension) required for semiconductor device circuits is decreasing year by year. In order to form a desired circuit pattern on semiconductor devices, a master or "original" pattern (also called a mask or a reticle) of high precision is needed. Thus, the electron beam writing technique, which intrinsically has excellent resolution, is used for producing such a highly precise master pattern.

FIG. 15 is a schematic diagram for explaining operations of a variable-shaped electron beam (EB) writing apparatus. As shown in the figure, the variable-shaped electron beam writing apparatus operates as follows: A first aperture plate 410 has a quadrangular, such as a rectangular, opening 411 for shaping an electron beam 330. A second aperture plate 420 has a variable-shape opening 421 for shaping the electron beam 330 that has passed through the opening 411 into a desired rectangular shape. The electron beam 330 emitted from a charged particle source 430 and having passed through the opening 411 is deflected by a deflector to pass through a part of the variable-shape opening 421 and thereby to irradiate a target workpiece or "sample" 340 mounted on a stage which continuously moves in one predetermined direction (e.g. X direction) during the writing. In other words, a rectangular shape capable of passing through both the opening 411 and the variable-shape opening 421 is used for pattern writing in the writing region of the target workpiece 340 on the stage. This method of forming a given shape by letting beams pass through both the opening 411 of the first aperture plate 410 and the variable-shape opening 421 of the second aperture plate 420 is referred to as a variable shaped beam (VSB) method.

In the electron beam writing described above, the dose of each shot is set such that a beam dose at the figure edge of a figure configured by connecting a plurality of shots is to be a threshold value of a dose required for resist pattern resolution. Usually, it is set such that about a half of a shot dose at the figure edge reaches the threshold value. For calculating a dose, one dose equation is used regardless of position of the irradiation. Therefore, when writing a figure configured by connecting a plurality of shots, the dose is set in each shot such that about a half of the dose reaches a threshold value irrespective of whether it is at the figure edge or not.

In the meantime, with recent miniaturization of patterns, writing time of the writing apparatus becomes long, and thus, shortening of the time is required. However, in order to write a pattern in accordance with sizes, it is necessary to make a calculated dose incident on a resist, and thus, the conventional method has a limit of reducing the writing time.

Here, in relation to a dose equation used in the electron beam writing, there is disclosed a method of calculating a dose, in order to correct a phenomenon called a proximity effect etc., by changing values, such as a base dose $D_{base}$ used for calculating a dose and a proximity effect correction coefficient η used for correcting a proximity effect, depending on positions. (Refer to e.g., Japanese Patent Application Laid-open (JP-A) No. 2007-150243). However, even in such a method, the dose equation used is the same one wherein variables are adjusted.

As described above, conventionally, each shot dose is calculated by using one dose equation which is input to the writing apparatus. When performing irradiation based on an incident dose calculated by the conventional dose equation, the total dose at each of all the regions except for a figure edge and a place on which nothing is written is larger than a threshold value of the resist. In order for the total dose at the figure edge to be a threshold value of the resist, the total dose in the vicinity of the figure edge needs to be larger than the threshold value of the resist. However, the total dose of a region sufficiently distant from the figure edge may be about the threshold value. This subject has not been taken into consideration in the conventional method. Therefore, for example, in the case of writing a figure configured by connecting a plurality of shots, when an incident dose of a region distant from the figure edge, sufficiently farther than the radius of forward scattering of the beam, is calculated by the conventional method, the dose of the region is larger than the threshold value of the resist. That is, when a dose is large, the irradiation time becomes long in accordance with the dose. Thus, as has been mentioned, an excessive dose exists depending on a figure or its irradiation position, and accordingly, there is a problem of taking a writing time longer than needed because of such excessive dose.

BRIEF SUMMARY OF THE INVENTION

In accordance with one aspect of the present invention, a beam writing apparatus includes a selection unit configured to select a dose equation from a plurality of dose equations for calculating a dose of a beam, for each small region of a plurality of small regions made by virtually dividing a writing region of a target workpiece into mesh-like regions, a dose calculation unit configured to calculate a dose of a beam which is shot into a small region of the plurality of small regions, by using a selected dose equation, for the each small region, and a writing unit configured to write a desired pattern in the small region, by using a calculated dose, for the each small region.

In accordance with one aspect of the present invention, a beam writing method includes selecting a dose equation from a plurality of dose equations for calculating a dose of a beam, for each small region of a plurality of small regions made by virtually dividing a writing region of a target workpiece into mesh-like regions, calculating a dose of a beam which is shot into a small region of the plurality of small regions, by using a selected dose equation, for the each small region, and writing a desired pattern in the small region, by using a calculated dose, for the each small region.

In accordance with one aspect of the present invention, a computer-readable recording medium storing a program to be executed by a computer, the program includes selecting a dose equation from a plurality of dose equations for calculating a dose of a beam, for each small region of a plurality of small regions made by virtually dividing a writing region of a target workpiece into mesh-like regions, and storing a selected dose equation in a storage device, and reading the selected dose equation from the storage device, calculating a dose of a beam which is shot into a small region of the plurality of small regions, by using the selected dose equation, and outputting a calculated dose, for the each small region.

DETAILED DESCRIPTION OF THE INVENTION

In the following Embodiments, there will be described a structure in which an electron beam is used as an example of a charged particle beam. The charged particle beam is not limited to the electron beam, and other charged particle beam, such as an ion beam, may also be used. Moreover, a variable-shaped electron beam writing apparatus will be described as an example of the charged particle beam apparatus.

Furthermore, in the Embodiments hereafter, there will be described an apparatus and a method that can reduce an excessive dose and improve throughput of the apparatus by shortening the writing time.

Embodiment 1

Figure 1:
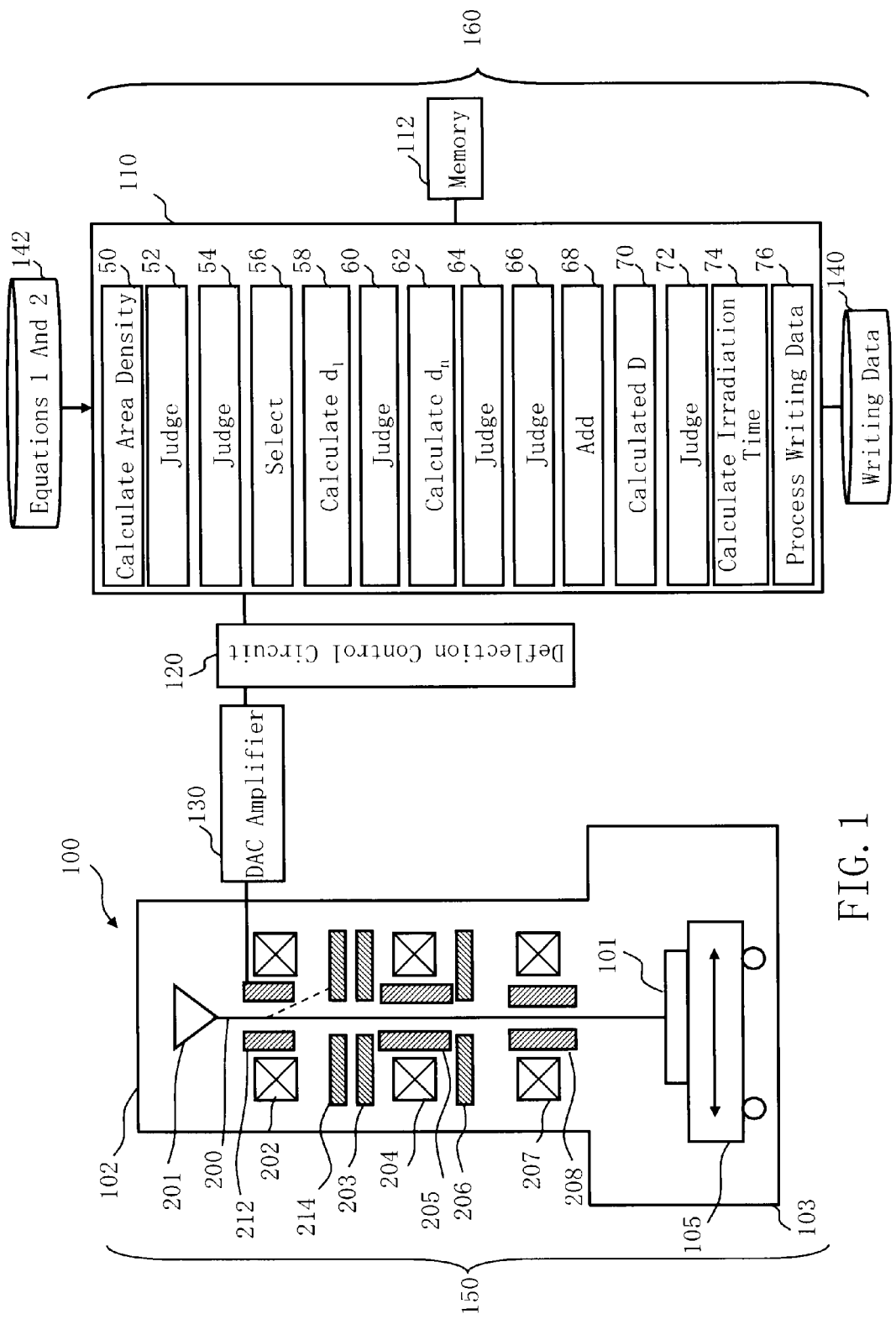
FIG. 1 shows a schematic diagram of a structure of a writing apparatus according to Embodiment 1.

FIG. 1 is a schematic diagram showing a structure of a writing apparatus according to Embodiment 1. In FIG. 1, a writing apparatus 100 includes a writing unit 150 and a control unit 160. The writing apparatus 100 is an example of a charged particle beam writing apparatus, and especially, an example of a variable-shaped electron beam (VSB) writing apparatus. The writing unit 150 includes an electron lens barrel 102 and a writing chamber 103. In the electron lens barrel 102, there are arranged an electron gun assembly 201, an illumination lens 202, a blanking deflector (blanker) 212, a blanking aperture 214, a first shaping aperture 203, a projection lens 204, a deflector 205, a second shaping aperture 206, an objective lens 207, and a deflector 208. In the writing chamber 103, there is arranged an XY stage 105 which is movable at least in the XY direction. On the XY stage 105, a target workpiece 101 serving as a writing target is placed. The target workpiece 101 is, for example, a mask for exposure, a silicon wafer, etc. used for manufacturing semiconductor devices. The mask is, for example, a mask blank where no patterns are formed.

The control unit 160 includes a control computer 110, a memory 112, a deflection control circuit 120, a DAC (digital analog converter) amplifier unit 130 (deflection amplifier), and a memory 140 such as a magnetic disk drive. The control computer 110, the memory 112, the deflection control circuit 120, and the memories 140 and 142 are mutually connected through a bus (not shown). The deflection control circuit 120 is connected to the DAC amplifier unit 130, and this unit 130 is connected to the blanking deflector 212.

A digital signal for blanking control is output from the deflection control circuit 120 to the DAC amplifier unit 130. Then, in the DAC amplifier unit 130, the digital signal is converted to an analog signal, and amplified to be applied as a deflection voltage to the blanking deflector 212. The electron beam 200 is deflected by the deflection voltage, to be formed as a beam of each shot.

Moreover, in the control computer 110, there are arranged an area density calculation unit 50, judgment units 52, 54, 60, 64, 66, and 72, a selection unit 56, a $d_1$ calculation unit 58, a $d_n$ calculation unit 62, an addition unit 68, a dose D calculation unit 70, an irradiation time calculation unit 74, and a writing data processing unit 76. Functions of them may be configured by software such as a program, or they may be configured by hardware such as an electronic circuit. Alternatively, they may be configured by a combination of software and hardware. Input data necessary for the control computer 110 or a calculated result is stored in the memory 112 each time. Similarly, the deflection control circuit 120 may be configured by a computer operated by software such as a program, or may be configured by hardware such as an electronic circuit etc. Alternatively, it may be configured by a combination of software and hardware. Here, FIG. 1 shows a structure necessary for describing Embodiment 1. Other structure elements generally necessary for the writing apparatus 100 may also be included. For example, a DAC amplifier unit for the deflector 205 or 208 is of course included.

Figure 2:
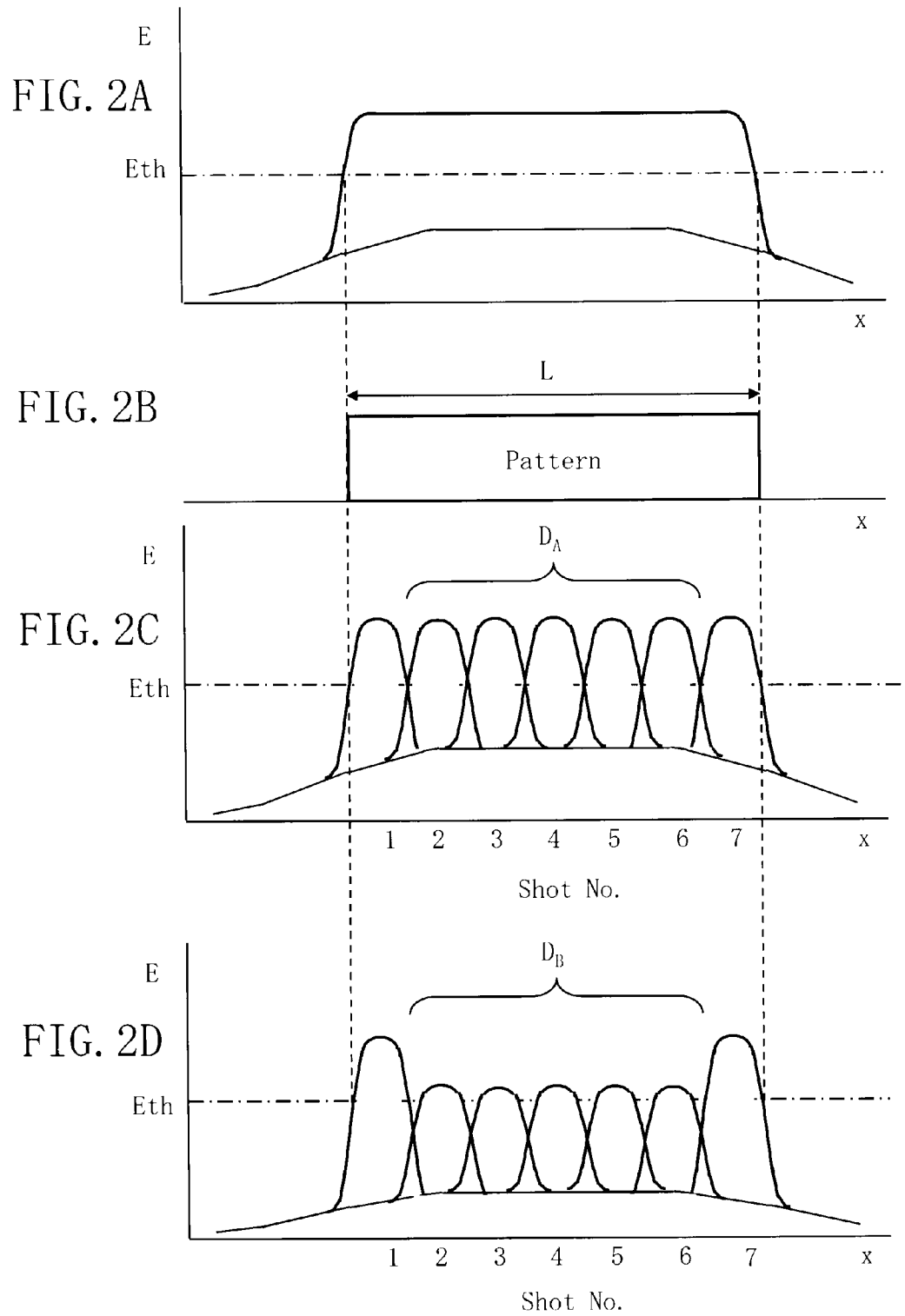
FIGS. 2A to 2D show examples of beam profiles in order to compare and explain a dose according to Embodiment 1 and a conventional dose.

FIGS. 2A to 2D show examples of beam profiles in order to compare and explain a dose according to Embodiment 1 and a conventional dose. When writing a figure pattern of width L shown in FIG. 2B, a dose is set such that a threshold value Eth of the dose required for resist pattern resolution is at the edge of the pattern as shown in FIG. 2A. For example, it is set such that about 50% of the incident dose reaches the threshold value Eth. When writing a figure pattern by a plurality of continuous shots, similarly with respect to a shot at the inner part of the figure, a dose is entered such that about a half of the incident dose of a shot reaches the threshold value Eth. Thus, as shown in FIG. 2C, the total dose amount increases inward from the edge of the figure, maintains approximately a fixed value at the inner part of the figure, and decreases such that it may become the threshold value Eth at the edge of the other side of the figure. However, at a position sufficiently farther than the range of beam forward scattering from the figure edge, such as the shots 2 to 6 at the inner part of the figure, it is, ideally, enough that an incident dose of a shot reaches the threshold value Eth of the dose. Then, according to Embodiment 1, as shown in FIG. 2D, the dose $D_B$ at the inner part of the region of the figure pattern is made to be less than the dose $D_A$ at the inner part of the region set by the conventional method. Owing to this configuration, the irradiation time of a shot can be shortened because of the reduction of the dose. Hereafter, a processing flow will be concretely described.

Figure 3:
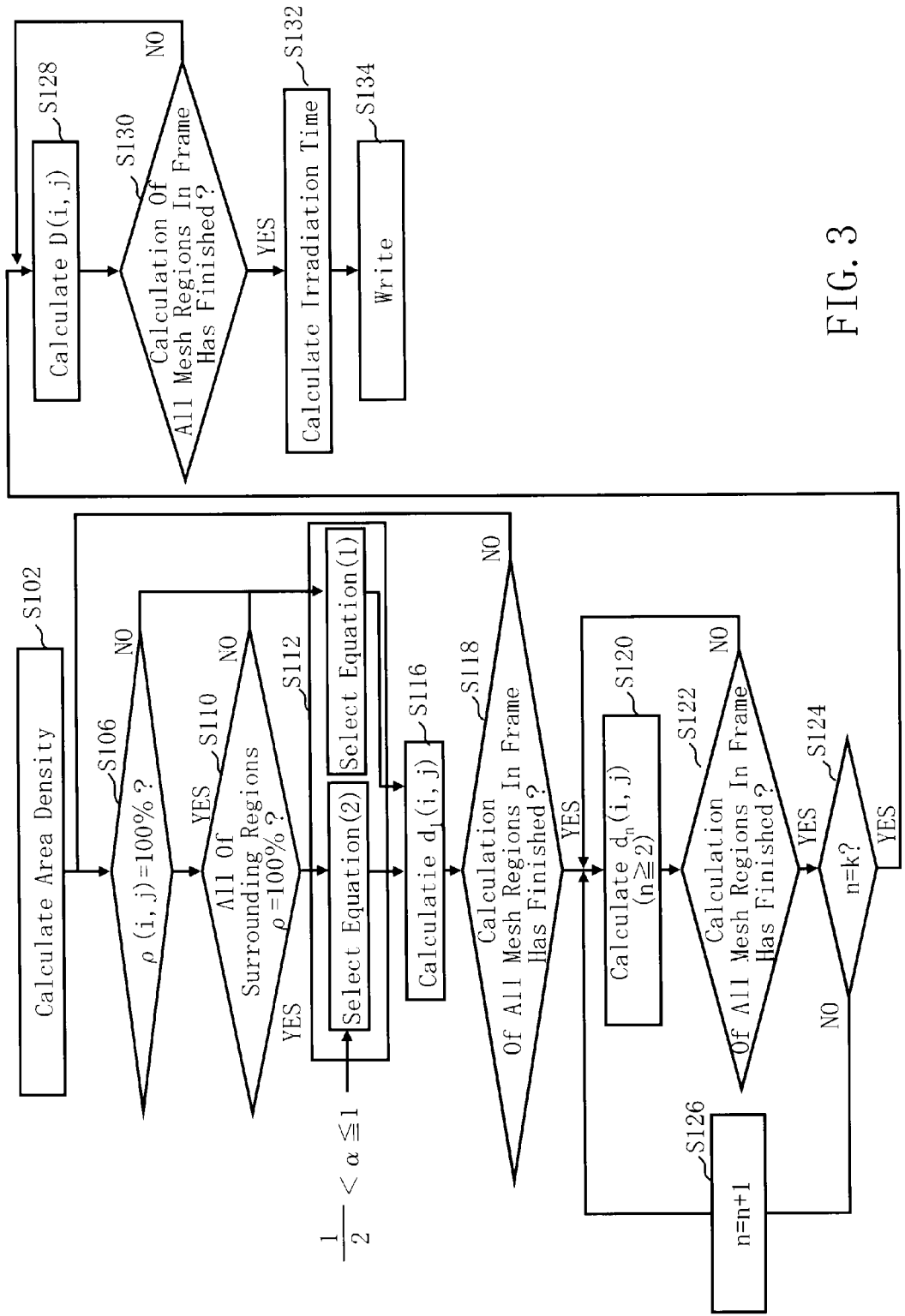
FIG. 3 shows a flowchart of main steps of a writing method according to Embodiment 1.

FIG. 3 is a flowchart showing the main steps of the writing method according to Embodiment 1. In FIG. 3, the writing method of Embodiment 1 executes a series of steps: area density calculation step (S102), judgment step (S106), judgment step (S110), selection step (S112), $d_1$ calculation step (S116), judgment step (S118), $d_n$ calculation step (S120), judgment step (S122), judgment step (S124), addition step (S126), dose D calculation step (S128), judgment step (S130), irradiation time calculation step (S132) and writing step (S134).

First, writing data is input from the outside of the writing apparatus 100 and stored in the memory 140. Then, in the writing apparatus 100, the writing data processing unit 76 reads the writing data, which was fed from the outside, from the memory 140, and performs a plurality of steps of data conversion processing. By the conversion processing of a plurality of steps, shot data unique to the writing apparatus is generated. Then, writing processing will be performed based on the shot data.

Figure 4:
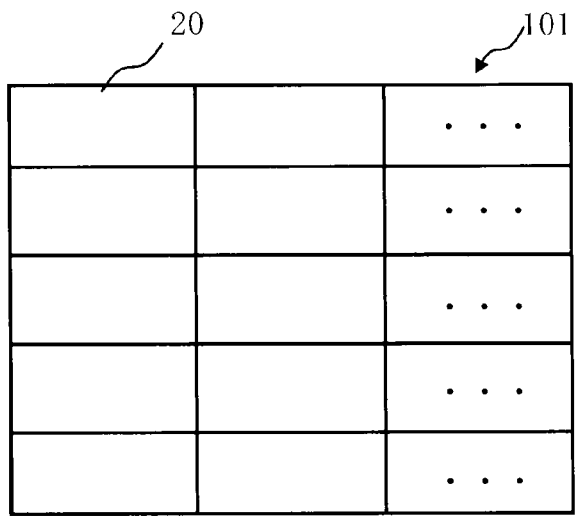
FIG. 4 shows a schematic diagram of an example of a frame region according to Embodiment 1.

FIG. 4 is a schematic diagram showing an example of a frame region according to Embodiment 1. As shown in FIG. 4, the writing surface of the target workpiece 101 is virtually divided into a plurality of frame regions 20 each being a writing region as a unit of calculation processing. Then, data processing in a plurality of frame regions are performed in parallel by a plurality of CPUs, etc. (not shown). The parallel processing is performed in order from the side of the frame region which is to be written first.

Moreover, the writing surface of the target workpiece 101 is virtually divided into mesh-like regions (an example of a small region) of a predetermined mesh size. The mesh size is to be larger than an influence radius of forward scattering of the electron beam 200. For example, it is preferable for the predetermined mesh size to be larger than 3σ of a forward scattering distribution of the electron beam 200. Moreover, it is preferable for the mesh size to be larger than the minimum shot size.

In the area density calculation step (S102), the area density calculation unit 50 reads writing data for each frame region from the storage device 140, and calculates a pattern area density ρ(i,j) in the mesh region at each mesh position. The coordinates (i,j) are set for each frame region.

In the judgment step (S106), the judgment unit 52 judges whether the pattern area density ρ(i,j) is 100% or not. If the judgment result is that the pattern area density ρ(i,j) is 100%, it goes to S110, and if it is not 100%, it goes to S112.

In the judgment step (S110), the judgment unit 54 judges whether the pattern area density ρ of each of a plurality of mesh regions surrounding the mesh region of the coordinates (i,j) is 100% or not.

Figure 5:
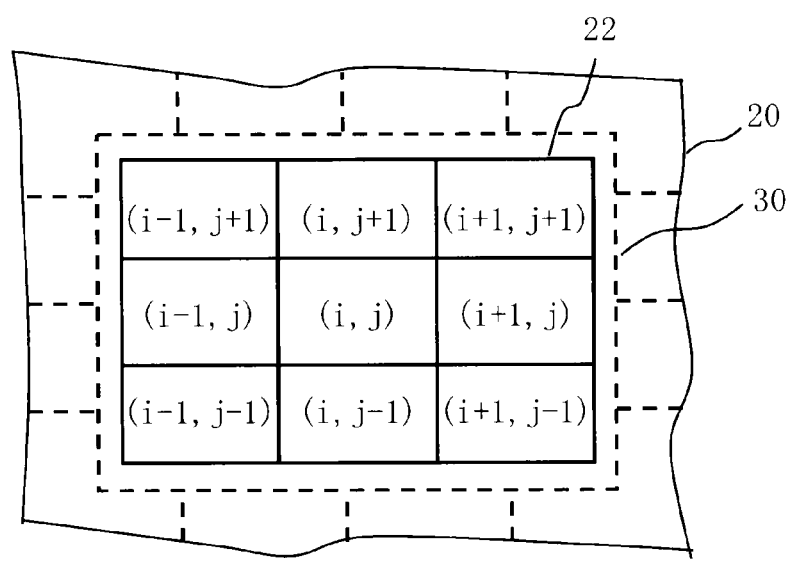
FIG. 5 shows a schematic diagram of an example of a mesh region according to Embodiment 1.

FIG. 5 shows a schematic diagram of an example of the mesh region according to Embodiment 1. In FIG. 5, it is assumed that there is a mesh region (i,j) in a certain frame region 20. The example of FIG. 5 shows a mesh region 22 of coordinates (i,j), and the eight mesh regions 22 of coordinates (i−1,j−1), (i,j−1), (i+1,j−1), (i−1,j), (i+1,j), (i−1,j+1), (i,j+1), and (i+1, j+1) which adjacently surround the mesh region 22 of coordinates (i,j). In the example of FIG. 5, these nine mesh regions 22 are located in a figure pattern 30. In this state, the pattern area density ρ(i,j) is 100%, and also the pattern area density ρ of each of the eight mesh regions 22 surrounding the mesh region 22 of coordinates (i,j) is 100%.

In the selection step (S112), the selection unit 56 selects one from a plurality of dose equations for each mesh region. In this case, two dose equations are used. One dose equation 1 is defined by the following equation (1).

$$\frac{1}{\beta}\left[\frac{D*(x)}{2} + \eta \int_A D^*(x')g_p(x-x')dx'\right] = 1 \quad (1)$$

Here, a normalized dose $D^*(x)$ is used. Moreover, in the equation (1), a proximity effect correction coefficient η, a distribution function gp(x), and a normalization factor β are used. For example, the normalization factor β=½+η. The dose $D^*(x)$ is calculated by the following equations (2) to (4).

$$D*(x) = \lim_{n \to \infty} \sum_{i=1}^{n} d_i(x) \quad (2)$$

$$d_1(x) = \frac{\beta}{\frac{1}{2} + \eta \int_A \rho(x')g_p(x-x')dx'} \quad (3)$$

$$d_n(x) = \frac{\eta \left[ \begin{array}{l} d_{n-1}(x)\int_A \rho(x')g_p(x-x')dx' - \\ \int_A d_{n-1}(x')\rho(x')g_p(x-x')dx' \end{array} \right]}{\frac{1}{2} + \eta \int_A \rho(x')g_p(x-x')dx'} \quad (4)$$

The other dose equation 2 is defined by the following equation (5).

$$\frac{1}{\beta}\left[\alpha D*(x) + \eta \int_A D^*(x')g_p(x-x')dx'\right] = 1 \quad (5)$$

For example, it becomes a normalization factor β=(½+η) or (α+η). Moreover, the dose $D^*(x)$ in the equation (5) is calculated by the equation (2) described above and the following equations (6) and (7).

$$d_1(x) = \frac{\beta}{\alpha + \eta \int_A \rho(x')g_p(x-x')dx'} \quad (6)$$

$$d_n(x) = \frac{\eta \left[ \begin{array}{l} d_{n-1}(x)\int_A \rho(x')g_p(x-x')dx' - \\ \int_A d_{n-1}(x')\rho(x')g_p(x-x')dx' \end{array} \right]}{\alpha + \eta \int_A \rho(x')g_p(x-x')dx'} \quad (7)$$

In the equations (5) to (7) used as the dose equation 2, each equation is defined by especially the value of ½<α≤1. That is, since the value α is used instead of the value ½ of the dose equation 1, the dose equations 1 and 2 can be distinguished. In the calculation of $d_1$ and $d_n$ of the dose equation 2, not ½ but the value α of ½<α≤ is used as a term of a denominator. Therefore, the dose calculated by the dose equation 2 can be made less than the dose calculated by the dose equation 1. As described above, at the shot position in the inner part of the figure, where the effect of forward scattering can be ignored, it is ideally enough for the dose to be the resolution threshold value Eth of the resist. In that case, it becomes α=1. However, since the maximum value is not necessarily fixed, it is preferable to set the value α to be greater than ½ used in the conventional method and less than or equal to 1. The greater the value α is, the less the maximum value of the dose can be. Therefore, an excessive dose can be avoided.

As described above, under the condition (first condition) that the pattern area density ρ(i,j) of the mesh region (i,j) concerned is 100% and each of the pattern area densities of the eight mesh regions which adjacently surround the mesh region (i,j) is 100%, the selection unit 56 selects the dose equation 2. On the other hand, under the condition (second condition) other than the above condition, the selection unit 56 selects the dose equation 1. In the mesh region where the dose equation 2 is selected, the dose can be made less than that in the case of calculating by using the dose equation 1. As described above, according to conditions, the selection unit 56 changes the dose equation to be selected. Hereafter, calculation of the dose will be specifically described.

In the $d_1$ calculation step (S116), the $d_1$ calculation unit 58 performs an internal calculation of the dose calculation to obtain a function $d_1(i,j)$ by using the equation (3) when a selected dose equation is the equation 1, and using the equation (6) when a selected dose equation is the equation 2.

In the judgment step (S118), the judgment unit 60 judges whether the function $d_1$ has been calculated with respect to all the mesh regions 22 in the frame concerned. Then, when there is a mesh region which has not been calculated, it returns to S106 and repeats from S106 to S118. If the function $d_1$ has been calculated with respect to all the mesh regions 22 in the frame concerned, it goes to S120.

In the $d_n$ calculation step (S120), the $d_n$ calculation unit 62 performs an internal calculation of the dose calculation to obtain a function $d_n(i,j)$ by using the equation (4) when the selected dose equation is the equation 1, and using the equation (7) when the selected dose equation is the equation 2. Since n=1 has already been calculated, first, the calculation starts with n=2. The dose equations 1 and 2 may be stored in the memory 142 to be read when selected for use.

In the judgment step (S122), the judgment unit 64 judges whether the function $d_n$ has been calculated with respect to all the mesh regions 22 in the frame concerned. Then, when there is a mesh region which has not been calculated, it returns to S120 and repeats S120 until the calculation of all the mesh regions has been completed. If the function $d_n$ has been calculated with respect to all the mesh regions 22 in the frame concerned, it goes to S124.

In the judgment step (S124), the judgment unit 66 judges whether n=k or not. k is a desired number of repetitions. k may be suitably set according to calculation precision. If k=1, it is unnecessary to perform S120, S122, and S126 to be described later, and if k=2, it is unnecessary to perform S126. If n=k, it goes to S128, and if not n=k, it goes to S126.

In the addition step (S126), the addition unit 68 adds 1 to n, and it returns to S120. By repeating from S120 to S126, calculation precision can be improved.

In the dose D calculation step (S128), the dose D calculation unit 70 calculates a dose $D(i,j)$ based on the calculation method of the equation (2), using the obtained $d_1, d_2,$ and ... $d_k$. Thus, as described above, a dose $D(i,j)$ can be obtained by the dose equation properly selected depending on mesh region positions.

In the judgment step (S130), the judgment unit 72 judges whether the dose D has been calculated with respect to all the mesh regions 22 in the frame concerned. Then, when there is a mesh region which has not been calculated, it returns to S128, and repeats S128 until the calculation of all the mesh regions has been completed. If the dose D has been calculated with respect to all the mesh regions 22 in the frame concerned, it goes to S132.

As described above, for each mesh region, the dose calculation unit calculates a dose D of the electron beam 200 to be shot in the mesh region concerned, by using a selected dose equation. The dose calculation unit is configured by, for example, the $d_1$ calculation unit 58, the $d_n$ calculation unit 62, the addition unit 68, and the dose D calculation unit 70.

In the irradiation time calculation step (S132), the irradiation time calculation unit 74 calculates an irradiation time T of the electron beam 200 in each shot. Since the dose D can be defined by a product of an irradiation time T and a current density J, the irradiation time T can be calculated by dividing the dose D by the current density J. The calculated irradiation time is output to the deflection control circuit 120.

In the writing step (S134), for each mesh region 22, the writing unit 150 writes a desired pattern in the mesh region concerned using the calculated dose. Specifically, it operates as follows: The deflection control circuit 120 outputs a digital signal which controls an irradiation time for each shot, to the DAC amplifier unit 130. Then, the DAC amplifier unit 130 converts the digital signal into an analog signal and amplifies it to be applied as a deflection voltage to the blanking deflector 212.

When passing through the blanking deflector 212, the electron beam 200 emitted from the electron gun assembly 201 (emission unit) is controlled by the blanking deflector 212 to pass through the blanking aperture 214 when in the state of beam-ON, and is deflected so that the entire beam may be blocked by the blanking aperture 214 when in the state of beam-OFF. The electron beam 200 passing through the blanking aperture 214, while changing the state from the beam-OFF to the beam-ON and lastly again to the beam-OFF, serves as a one-time shot of the electron beam. The blanking deflector 212 controls the direction of the passing electron beam 200 to alternately generate the state of beam-ON and the state of beam-OFF. For example, voltage is not applied when in the state of beam-ON, and is applied to the blanking deflector 212 when in the state of beam-OFF. The dose per shot of the electron beam 200 to irradiate the target workpiece 101 is adjusted by the irradiation time T of each shot.

The electron beam 200 of each shot generated by passing through the blanking deflector 212 and the blanking aperture 214 as described above irradiates the whole of the first shaping aperture 203, which has a quadrangular opening such as a rectangular opening, by the illumination lens 202. At this time, the electron beam 200 is first shaped to be a quadrangle such as a rectangle. Then, after having passed through the first shaping aperture 203, the electron beam 200 of a first aperture image is projected onto the second shaping aperture 206 by the projection lens 204. Then, the first aperture image on the second shaping aperture 206 is deflection-controlled by the deflector 205 so as to change the shape and size of the beam (variable shaping). Such variable shaping is performed for each shot, and, usually, each shot is shaped to be a beam having a different shape and size. After having passed through the second shaping aperture 206, the electron beam 200 of a second aperture image is focused by the objective lens 207, and deflected by the deflector 208, to reach a desired position on the target workpiece placed on the XY stage 105 which moves continuously. As described above, by each deflector, a plurality of shots of the electron beam 200 are deflected, in order, onto the target workpiece 101 serving as a substrate.

The calculation processing in each frame 20 is performed in order in real time in accordance with the advancement of the writing processing.

According to Embodiment 1 as described above, it is possible to properly select and use a dose equation according to the figure and the position. Therefore, it is possible to control the dose itself which is to be calculated. Thus, an excessive dose can be suppressed in the region at the inner part of the figure, where the area density of each of surrounding regions is 100% and the pattern size is not affected by forward scattering. As a result, the writing time can be reduced and thereby, the throughput of the apparatus can be increased.

Embodiment 2

Although, in Embodiment 1, the condition (first condition) that the pattern area density $\rho(i,j)$ of the mesh region $(i,j)$ concerned is 100% and each of the pattern area densities of the eight mesh regions which adjacently surround the mesh region $(i,j)$ concerned is 100% is used as a condition of selecting the dose equation 2, it is not limited thereto. In Embodiment 2, other selection conditions will be described.

Figure 6:
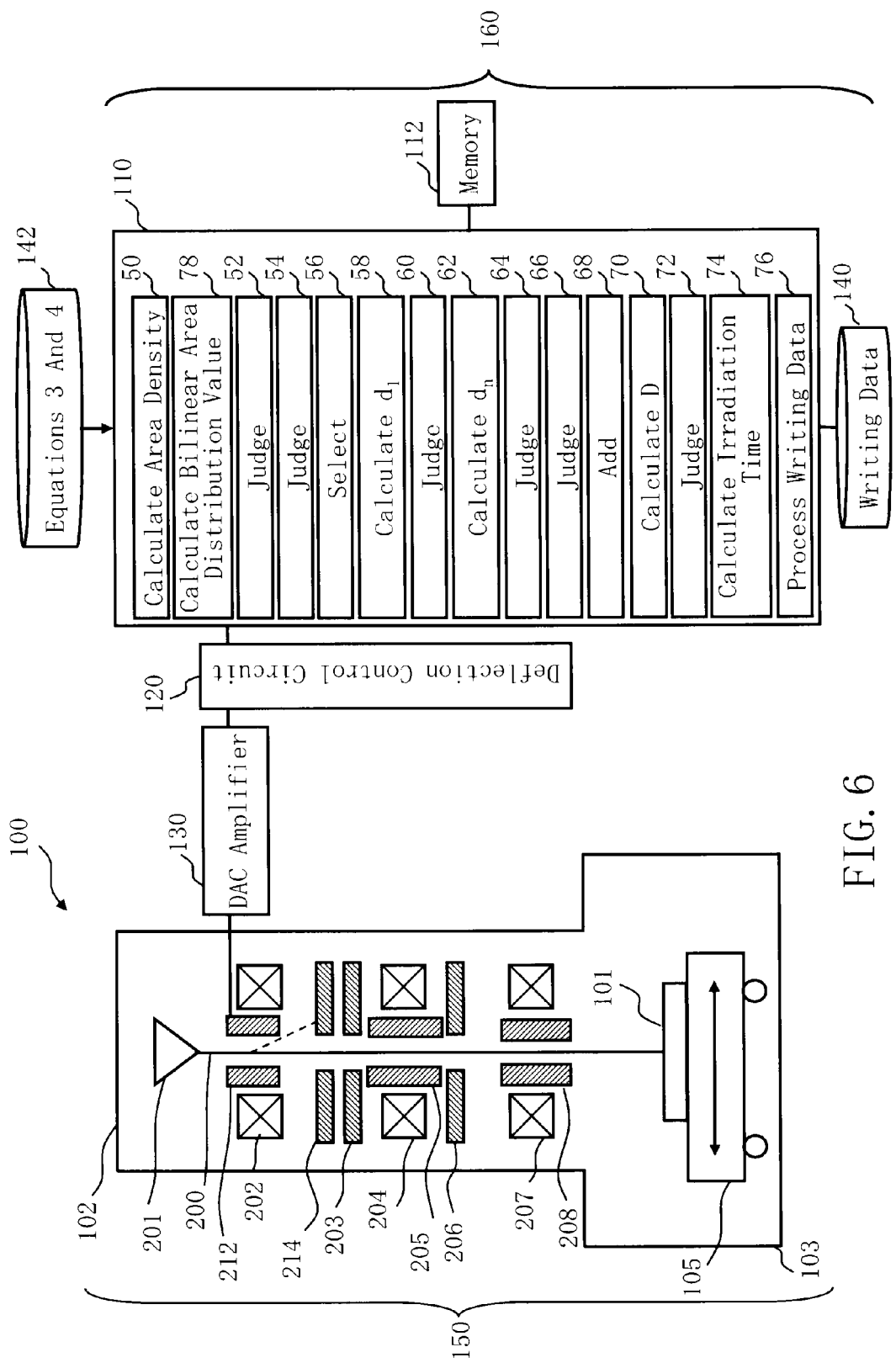
FIG. 6 shows a schematic diagram of a structure of a writing apparatus according to Embodiment 2.

FIG. 6 is a schematic diagram showing a structure of the writing apparatus according to Embodiment 2. Except for adding a bilinear area distribution value calculation unit 78 in the control computer 110, FIG. 6 is the same as FIG. 1.

Figure 7:
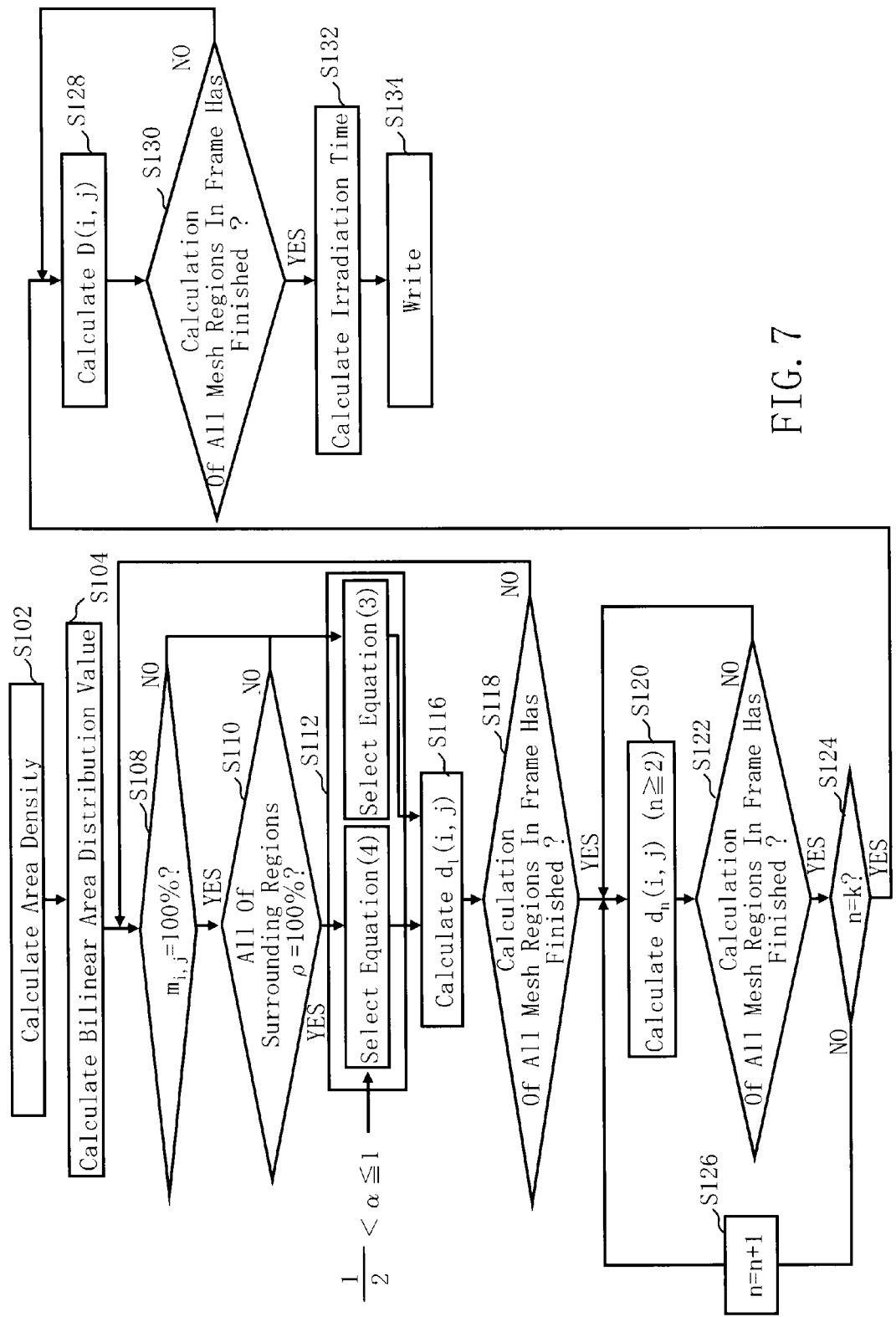
FIG. 7 shows a flowchart of main steps of a writing method according to Embodiment 2.

FIG. 7 is a flowchart showing main steps of a writing method according to Embodiment 2. FIG. 7 is the same as FIG. 3 except for adding the judgment step (S108) instead of the judgment step (S106), adding a bilinear area distribution value calculation step (S104) between the area density calculation step (S102) and the judgment step (S108), changing judgment contents of the judgment step (S110), and changing the contents of the equation selected in the selection step (S112). In the following, the description is the same as Embodiment 1 except for the contents specially explained.

In the bilinear area distribution value calculation step (S104), the bilinear area distribution value calculation unit 78 calculates a bilinear area distribution value at the reference position of each mesh region 22.

Figure 8:
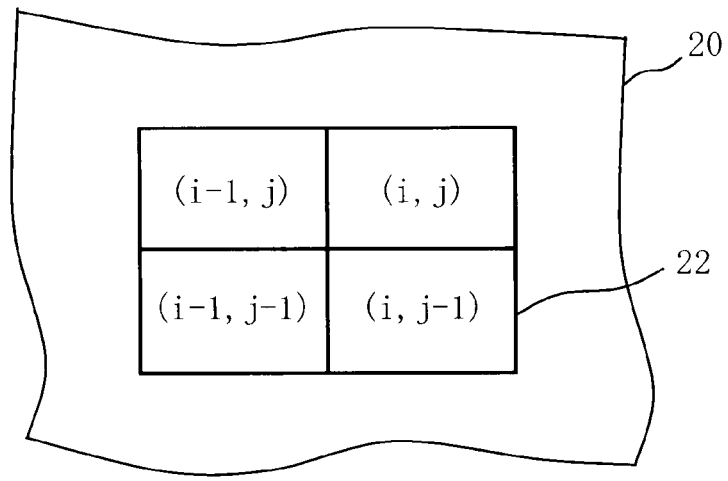
FIG. 8 shows an example of a mesh region in relation to calculation of a bilinear area distribution value according to Embodiment 2.

FIG. 8 shows an example of a mesh region in relation to calculation of a bilinear area distribution value according to Embodiment 2. In FIG. 8, let the lower left vertex be a reference position of each mesh region 22 in the frame region 20. Four mesh regions 22 surrounding the vertex used as the reference position of the mesh region $(i,j)$ are shown in the example of FIG. 8. That is, they are four mesh regions 22: a mesh region $(i,j)$, a mesh region $(i-1, j-1)$, a mesh region $(i,j-1)$, and a mesh region $(i-1,j)$. In Embodiment 2, when selecting a dose equation of the mesh region $(i,j)$ to be described later, these four mesh regions 22 are used.

Figure 9:
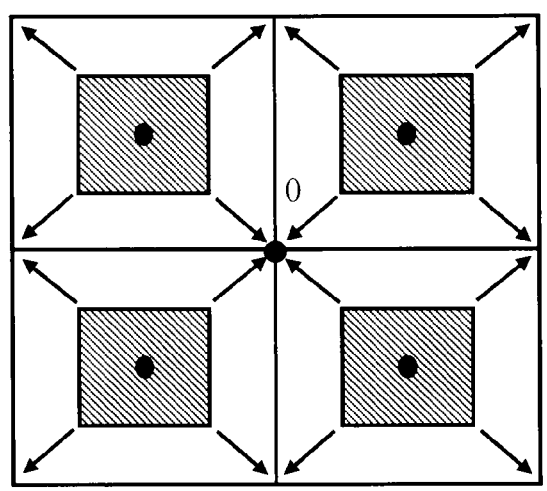
FIG. 9 shows a schematic diagram for explaining a method of calculating a bilinear area distribution value according to Embodiment 2.

FIG. 9 shows a schematic diagram for explaining a method of calculating a bilinear area distribution value according to Embodiment 2. In FIG. 9, with respect to the figure in each mesh region, the area density of the figure is allocated to each vertex. For example, the area density of the figure in each mesh region is distributed to the four vertexes of each mesh region such that the center of gravity position of the figure in each mesh region is not changed. For example, if the gravity center of the figure of area density 100% exists at the center of the mesh region, 0.25 (25%) is distributed to each of the four vertexes. Since each mesh region 22 shares the vertex with adjacent mesh regions, an area density allocated in each adjacent mesh region exists at each vertex. Then, such area densities are added to each vertex. The area density added at the reference position of the mesh region $(i,j)$ is a bilinear area distribution value $m(i,j)$ of the mesh region $(i,j)$.

In the judgment step (S108), the judgment unit 52 judges whether the bilinear area distribution value $m(i,j)$ is 1 or not. If the judgment result is that the bilinear area distribution value $m(i,j)$ is 1, it goes to S110, and if not 1, it goes to S112.

Figure 10:
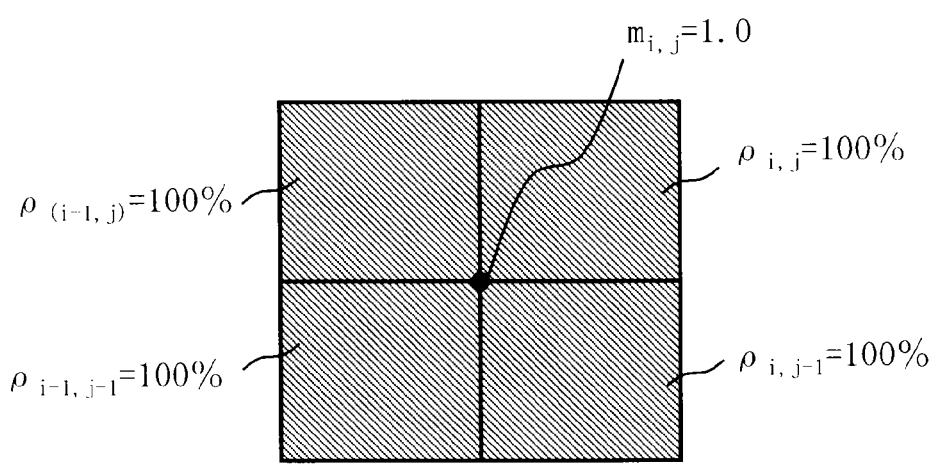
FIG. 10 shows a schematic diagram of an example of a mesh region according to Embodiment 2.

FIG. 10 shows a schematic diagram of an example of the mesh region according to Embodiment 2. In FIG. 10, it is assumed that there is a mesh region $(i,j)$ in a certain frame region 20. The example of FIG. 10 shows the mesh region 22 of coordinates $(i,j)$ and the four mesh regions 22 of coordinates $(i,j)$, $(i-1, j-1)$, $(i,j-1)$, and $(i-1, j)$ which are adjacent to the mesh region 22 of coordinates $(i,j)$ and surround the vertex of the reference position of the mesh region 22 of $(i,j)$. The example of FIG. 10 shows the case where the pattern area density $\rho$ of each of the four mesh regions 22 is 100%. Then, in this state, since 0.25 (25%) of the area density is distributed to the vertex being the reference position of the mesh region of coordinates $(i,j)$ from each of the mesh regions surrounding the vertex, it becomes the bilinear area distribution value $m(i,j)=1$.

In the judgment step (S110), the judgment unit 54 judges whether the pattern area density $\rho$ of each of a plurality of mesh regions surrounding the vertex being a reference position of the mesh region of coordinates $(i,j)$ is 100% or not.

In the selection step (S112), the selection unit 56 selects one from a plurality of dose equations for each mesh region. In this case, two dose equations 3 and 4 are used. The dose equation 3 is defined by the equation (1) described above. However, calculation equations of the functions $d_1$ and $d_n$ are different from those for the equation (1). In the dose equation 3, a dose $D^*(x)$ is calculated using equations (8) and (9). In both the equations, a bilinear area distribution value $m(x)$ is used instead of the area density $\rho(x)$.

$$d_1(x) = \frac{\beta}{\frac{1}{2} + \eta \int_A m(x') g_p(x-x') dx'} \quad (8)$$

$$d_n(x) = \frac{\eta \left[ \begin{array}{c} d_{n-1}(x) \int_A m(x') g_p(x-x') dx' - \\ \int_A d_{n-1}(x') m(x') g_p(x-x') dx' \end{array} \right]}{\frac{1}{2} + \eta \int_A m(x') g_p(x-x') dx'} \quad (9)$$

The dose equation 4 is defined by the equation (5) described above. However, also here, calculation equations of the functions $d_1$ and $d_n$ are different from those for the equation (5). In the dose equation 4, a dose $D^*(x)$ is calculated using equations (10) and (11).

$$d_1(x) = \frac{\beta}{\alpha + \eta \int_A m(x') g_p(x-x') dx'} \quad (10)$$

$$d_n(x) = \frac{\eta \left[ \begin{array}{c} d_{n-1}(x) \int_A m(x') g_p(x-x') dx' - \\ \int_A d_{n-1}(x') m(x') g_p(x-x') dx' \end{array} \right]}{\alpha + \eta \int_A m(x') g_p(x-x') dx'} \quad (11)$$

In the equations (5), (10) and (11) used as the dose equation 4, each equation is defined by especially the value of $½<α≤$. That is, since the value α is used instead of the value ½ of the dose equation 3, the dose equations 3 and 4 can be distinguished. In the calculation of $d_1$ and $d_n$ of the dose equation 4, not ½ but the value α of $½<α≤$ is used as a term of a denominator. Therefore, the dose calculated by the dose equation 4 can be made less than the dose calculated by the dose equation 3. As described above, at the shot position in the inner part of the figure, where the effect of forward scattering can be ignored, it is ideally enough for the dose to be the resolution threshold value Eth of the resist. In that case, it becomes α=1. However, since the maximum value is not necessarily fixed, it is preferable to set the value α to be greater than ½ used in the conventional method and less than or equal to 1. The greater the value α is, the less the maximum value of the irradiation energy can be. Therefore, an excessive dose can be avoided.

As described above, under the condition (first condition) that the bilinear area distribution value m(i,j) of the mesh region (i,j) concerned is 100% and each of the pattern area densities of the four mesh regions which adjacently surround the vertex used as the reference position of the mesh region (i,j) is 100%, the selection unit 56 selects the dose equation 4. On the other hand, under the condition (second condition) other than the above condition, the selection unit 56 selects the dose equation 3. In the mesh region where the dose equation 4 is selected, the dose can be made less than that in the case of calculating by using the dose equation 3. As described above, according to conditions, the selection unit 56 changes the dose equation to be selected. The contents of each step after the $d_1$ calculation step (S116) are the same as those of Embodiment 1. The dose equations 3 and 4 may be stored in the memory 142 to be read when selected for use.

As described above, the number of mesh regions used for judging can be reduced by using a bilinear area distribution value. The same effect as Embodiment 1 can also be obtained in Embodiment 2.

Embodiment 3

In Embodiments 1 and 2, the case of writing using a charged particle beam has been explained. However, the method of selecting and using a dose equation described above is not limited to be applied to the case of a charged particle beam. It is also preferable to be applied to the case of a light beam (laser beam). In the following, the description is the same as Embodiment 1 except for the contents specially explained.

Figure 11:
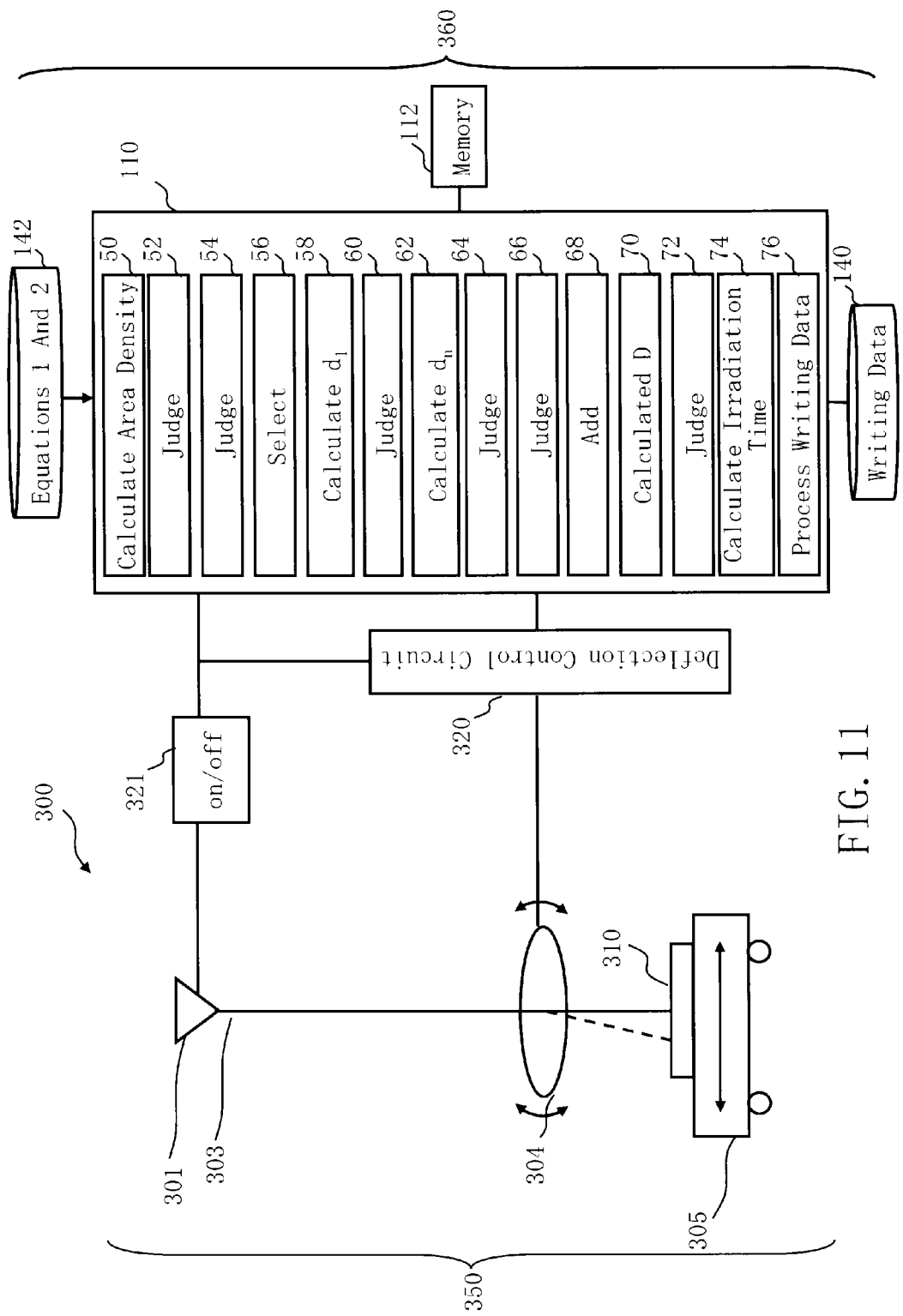
FIG. 11 shows a schematic diagram of a structure of a writing apparatus according to Embodiment 3.

FIG. 11 shows a schematic diagram of a structure of the writing apparatus according to Embodiment 3. In FIG. 11, the writing apparatus 300 is an example of a laser beam writing apparatus. The writing apparatus 300 includes a writing unit 350 and a control unit 360. The writing unit 350 includes a light source 301, a lens 304, and a stage 305. The control unit 360 includes a control computer 110, a memory 112, a deflection control circuit 320, a switch circuit 321, and memories 140 and 142, such as a magnetic disk. The internal structure of the control computer 110 is the same as that of FIG. 1.

Functions, such as the area density calculation unit 50, the judgment units 52, 54, 60, 64, 66, and 72, the selection unit 56, the $d_1$ calculation unit 58, the $d_n$ calculation unit 62, the addition unit 68, the dose D calculation unit 70, the irradiation time calculation unit 74, and the writing data processing unit 76 may be configured by software such as a program, or they may be configured by hardware such as an electronic circuit. Alternatively, they may be configured by a combination of software and hardware. Input data necessary for the control computer 110 or a calculated result is stored in the memory 112 each time. Similarly, the deflection control circuit 320 may be configured by a computer operated by software such as a program, or may be configured by hardware such as an electronic circuit etc. Alternatively, it may be configured by a combination of software and hardware. Here, FIG. 11 shows a structure necessary for describing Embodiment 3. Other structure elements generally necessary for the writing apparatus 300 may also be included.

Even in the case of using a laser, conventionally, the same maximum dose $D_A$ is entered from the shot 1 at the figure edge to the shot 7 at the figure edge of the other side as shown in FIG. 2C. However, as described above, for example, at the position, such as the shots 3 to 5 in the inner part of the figure, it is, ideally, enough that a dose of a beam shot reaches the threshold value Eth of the resist resolution. Then, according to Embodiment 3, as shown in FIG. 2D, the dose $D_B$ at the inner part of the region of the figure pattern is made to be less than the dose $D_A$ at the edge. Owing to this configuration, the irradiation time of a shot can be shortened because of the reduction of the dose.

Also in the configuration of the writing apparatus 300, the dose can be similarly calculated by the control computer 110 explained in Embodiment 1. The main steps of the writing method according to Embodiment 3 are the same as those of the flowchart shown in FIG. 2. The contents of each step from the area density calculation step (S102) to the irradiation time calculation step (S132) are the same as those in Embodiment 1. However, when using a laser beam, a proximity effect correction coefficient η of the equations (1) and (5) may be η=0 or a sufficiently small value. Alternatively, the integral terms of the equations (1) and (5) may be omitted. Similarly, the integral terms of the denominators of the equations (3) and (6) may be omitted. Moreover, since the proximity effect correction coefficient η may be η=0 or a sufficiently small value, the calculation after d2 in the equations (2), (4), and (7) may be omitted.

In Embodiment 3, when writing using a laser beam, the condition (first condition) that the pattern area density ρ(i,j) of the mesh region (i,j) concerned is 100% and each of the pattern area densities of the eight mesh regions which adjacently surround the mesh region (i,j) concerned is 100% may be used as a condition of selecting the dose equation 2.

As described above, the dose calculation unit calculates a dose D of the electron beam 200 to be shot into the mesh region concerned by using a selected dose equation, for each mesh region. The dose calculation unit is, for example, composed of the $d_1$ calculation unit 58, the $d_n$ calculation unit 62, the addition unit 68, and the dose D calculation unit 70.

In the irradiation time calculation step (S132), the irradiation time calculation unit 74 calculates an irradiation time T of the laser beam 303 of each shot. The calculated irradiation time is output to the switch circuit 321.

In the writing step (S134), the writing unit 350 writes a desired pattern in the mesh region concerned using the calculated dose, for each mesh region 22. Specifically, it operates as follows:

In the state of beam-ON, the direction of the laser beam 303 emitted from the suitable light source 301 which received an ON control signal from the switch circuit 321 is changed by the lens 304. Then, by the lens 304, the laser beam 303 irradiates a desired position on a target workpiece 310 placed on the XY stage 305 which moves continuously. The light source 301 emits the laser beam 303 based on a beam-ON control signal from the switch circuit 321, and stops emitting the laser beam 303 based on a beam-OFF control signal. The laser beam 303 emitted from the light source 301, while changing the state from the beam-OFF to the beam-ON and lastly again to the beam-OFF, serves as a one-time shot of the beam. The dose per shot of the laser beam 303 irradiating the target workpiece 101 is adjusted by the irradiation time T of each shot. As described above, by the lens 304 and the light source 301, a plurality of shots of the laser beam 303 are deflected, in order, onto the target workpiece 310 serving as a substrate.

According to Embodiment 3 as described above, it is possible to properly select and use a dose equation according to the figure and the position. Therefore, it is possible to control the dose itself which is to be calculated. Thus, an excessive dose can be suppressed in the region at the inner part of the figure, where the area density of each of surrounding regions is 100% and the pattern size is not affected by forward scattering. As a result, the writing time can be reduced and thereby, the throughput of the apparatus can be increased.

Embodiment 4

Although, in Embodiment 3, the condition (first condition) that the pattern area density $\rho(i,j)$ of the mesh region (i,j) concerned is 100% and each of the pattern area densities of the eight mesh regions which adjacently surround the mesh region (i,j) concerned is 100% is used as a condition of selecting the dose equation 2 in the case of using a laser beam, it is not limited thereto. In Embodiment 4, there will be explained the case of using the same selection condition as that of Embodiment 2.

Figure 12:
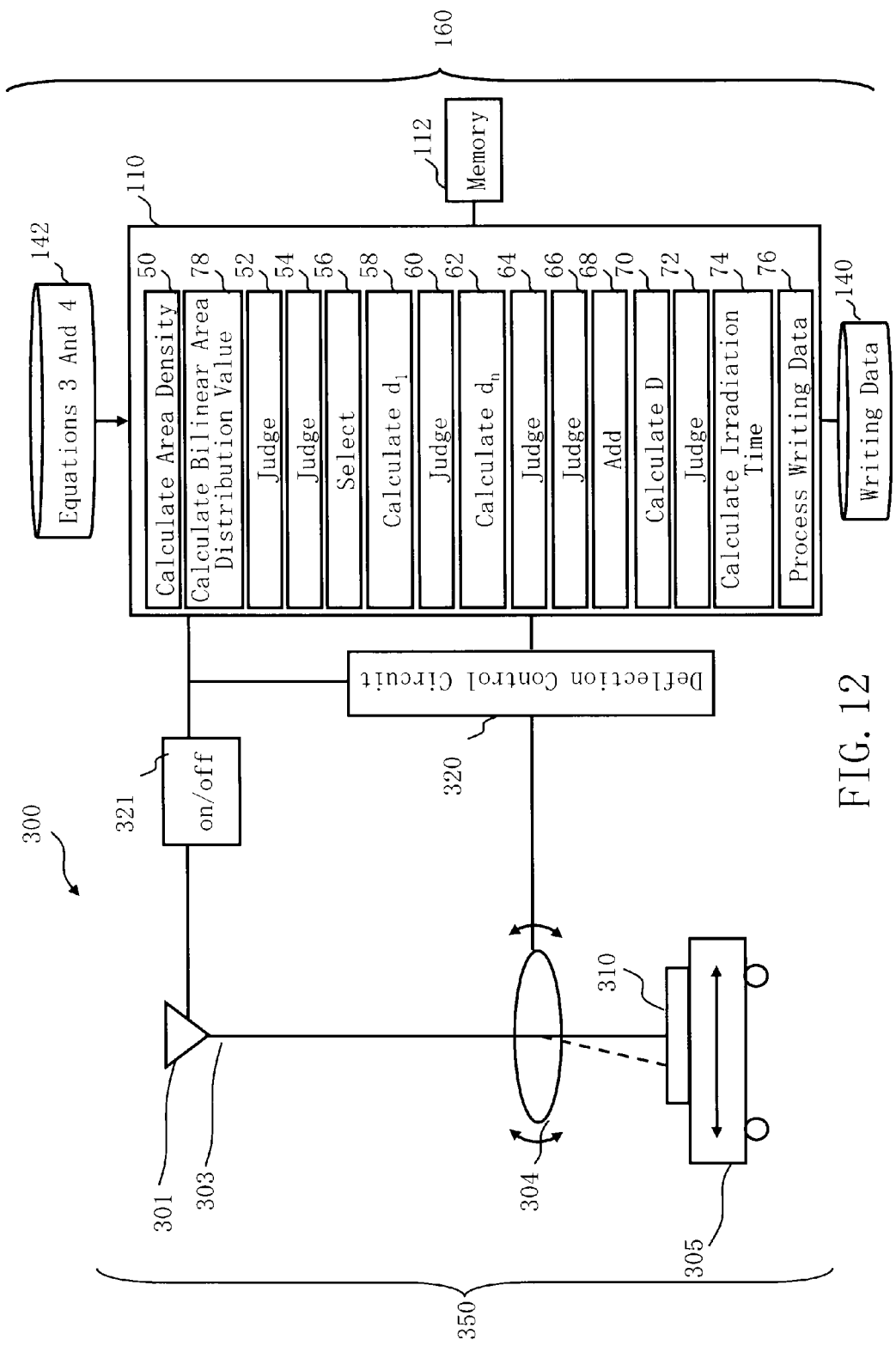
FIG. 12 shows a schematic diagram of a structure of a writing apparatus according to Embodiment 4.

FIG. 12 is a schematic diagram showing a structure of the writing apparatus according to Embodiment 4. Except for adding the bilinear area distribution value calculation unit 78 in the control computer 110, FIG. 12 is the same as FIG. 11.

The flowchart showing the main steps of the writing method according to Embodiment 4 is the same as that of FIG. 7. In the following, the description is the same as Embodiment 2 except for the contents specially explained. The contents of each step up to the irradiation time calculation step (S132) are the same as those in Embodiment 2. However, when using a laser beam, a proximity effect correction coefficient $\eta$ of the equations (1) and (5) may be $\eta=0$ or a sufficiently small value. Alternatively, the integral terms of the equations (1) and (5) may be omitted. Similarly, the integral terms of the denominators of the equations (8) and (10) may be omitted. Moreover, since the proximity effect correction coefficient $\eta$ may be $\eta=0$ or a sufficiently small value, the calculation after d2 in the equations (2), (9), and (11) may be omitted.

In the irradiation time calculation step (S132), the irradiation time calculation unit 74 calculates an irradiation time T of the laser beam 303 of each shot. The calculated irradiation time is output to the switch circuit 321.

In the writing step (S134), the writing unit 350 writes a desired pattern in the mesh region concerned using the calculated dose, for each mesh region 22. Specifically, it operates as follows:

In the state of beam-ON, the direction of the laser beam 303 emitted from the suitable light source 301 which received an ON control signal from the switch circuit 321 is changed by the lens 304. Then, by the lens 304, the laser beam 303 irradiates a desired position on the target workpiece 310 placed on the XY stage 305 which moves continuously. The light source 301 emits the laser beam 303 based on a beam-ON control signal from the switch circuit 321, and stops emitting the laser beam 303 based on a beam-OFF control signal. The laser beam 303 emitted from the light source 301, while changing the state from the beam-OFF to the beam-ON and lastly again to the beam-OFF, serves as a one-time shot of the beam. The dose per shot of the laser beam 303 irradiating the target workpiece 101 is adjusted by the irradiation time T of each shot. As described above, by the lens 304 and the light source 301, a plurality of shots of the laser beam 303 are deflected, in order, onto the target workpiece 310 serving as a substrate.

As described above, under the condition (first condition) that the bilinear area distribution value m(i,j) of the mesh region (i,j) concerned is 100% and each of the pattern area densities of the four mesh regions which adjacently surround the vertex used as the reference position of the mesh region (i,j) is 100%, the selection unit 56 selects the dose equation 4. On the other hand, under the condition (second condition) other than the above condition, the selection unit 56 selects the dose equation 3. In the mesh region where the dose equation 4 is selected, the dose can be made less than that in the case of calculating by using the dose equation 3. As described above, according to conditions, the selection unit 56 changes the dose equation to be selected. The contents of each step after the $d_1$ calculation step (S116) are the same as those of Embodiment 1.

As described above, the number of mesh regions used for judging can be reduced by using a bilinear area distribution value. The same effect as Embodiment 3 can also be obtained in Embodiment 4.

Figure 13A:
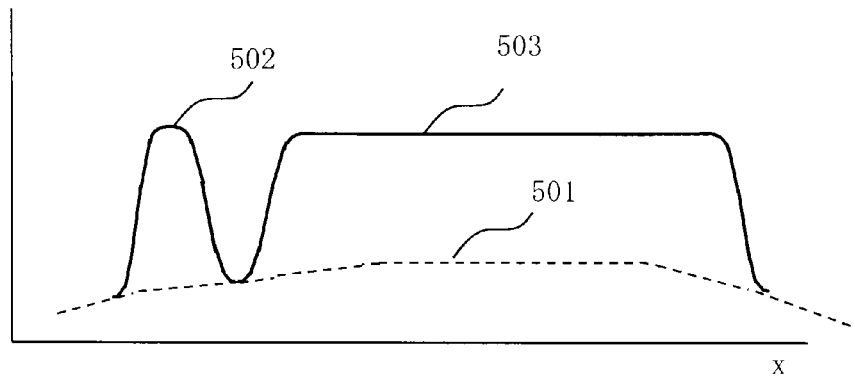
FIGS. 13A to 13C show comparative examples of dose profiles under the effect of backward scattering described in each Embodiment and a conventional method, and an example of pattern dimension in each Embodiment.
Figure 13B:
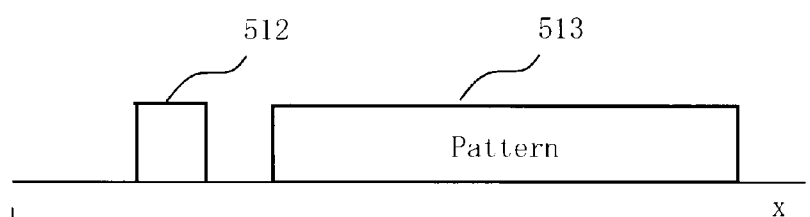
Figure 13C:
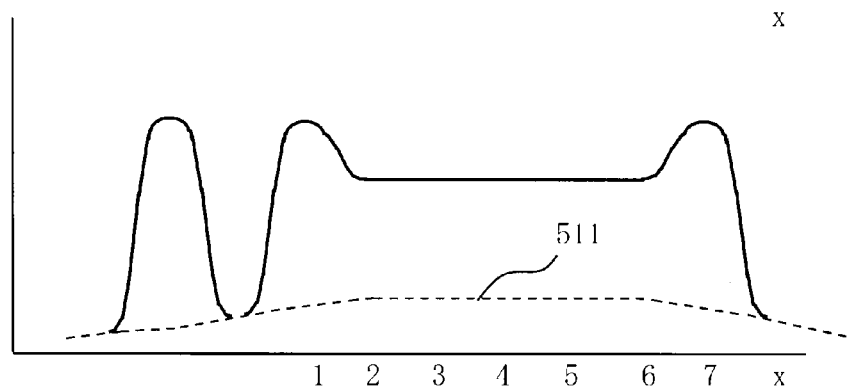

FIGS. 13A to 13C show comparative examples of dose profiles under the effect of backward scattering described in each Embodiment and a conventional method, and an example of pattern dimension in each Embodiment. FIG. 13A shows the case where the dose of the pattern 513 is calculated by one equation without selecting a dose equation according to the conventional method. Conventionally, as shown in FIG. 2C, for example, a dose is entered such that about a half of the incident dose of each shot, from the shot 1 at the figure edge to the shot 7 at the other side edge of the pattern 513, reaches a threshold value of the dose. In such a case, a dose 501 by backward scattering becomes large, and because of the effect of the backscatter dose 501, contrast of the dose decreases not only at the edge of the pattern 513 but also in an adjacent pattern 512. On the other hand, as has been explained in each Embodiment, by making a dose $D_B$ at the inner part of the region of the figure pattern 513 be a dose whose incident dose reaches a threshold value, a backscatter dose 511 in the pattern 513 can be reduced as shown in FIG. 13C described for each Embodiment. Therefore, the effect of the backscatter dose 511 becomes small, and thereby, dose contrast can be made higher, not only at the edge of the pattern 513 but also in the adjacent pattern 512 as shown in FIG. 13B described for each Embodiment, than that of the conventional method.

Figure 14A:
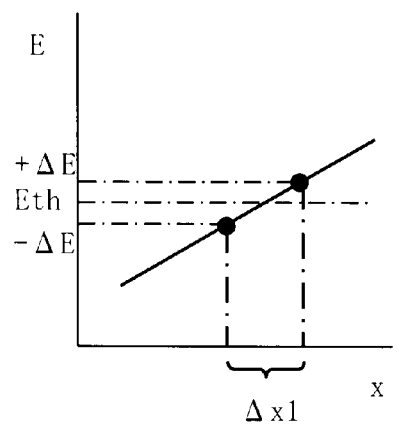
FIGS. 14A and 14B show comparative examples of dimensional variation amounts with respect to irradiation error described in each Embodiment and a conventional method.
Figure 14B:
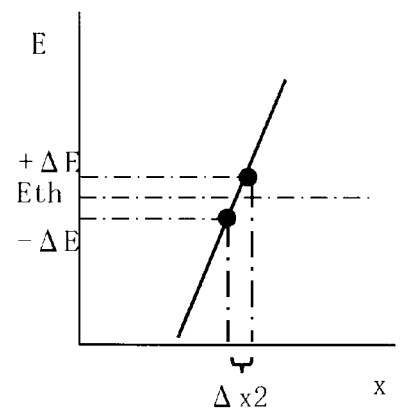
Figure 15:
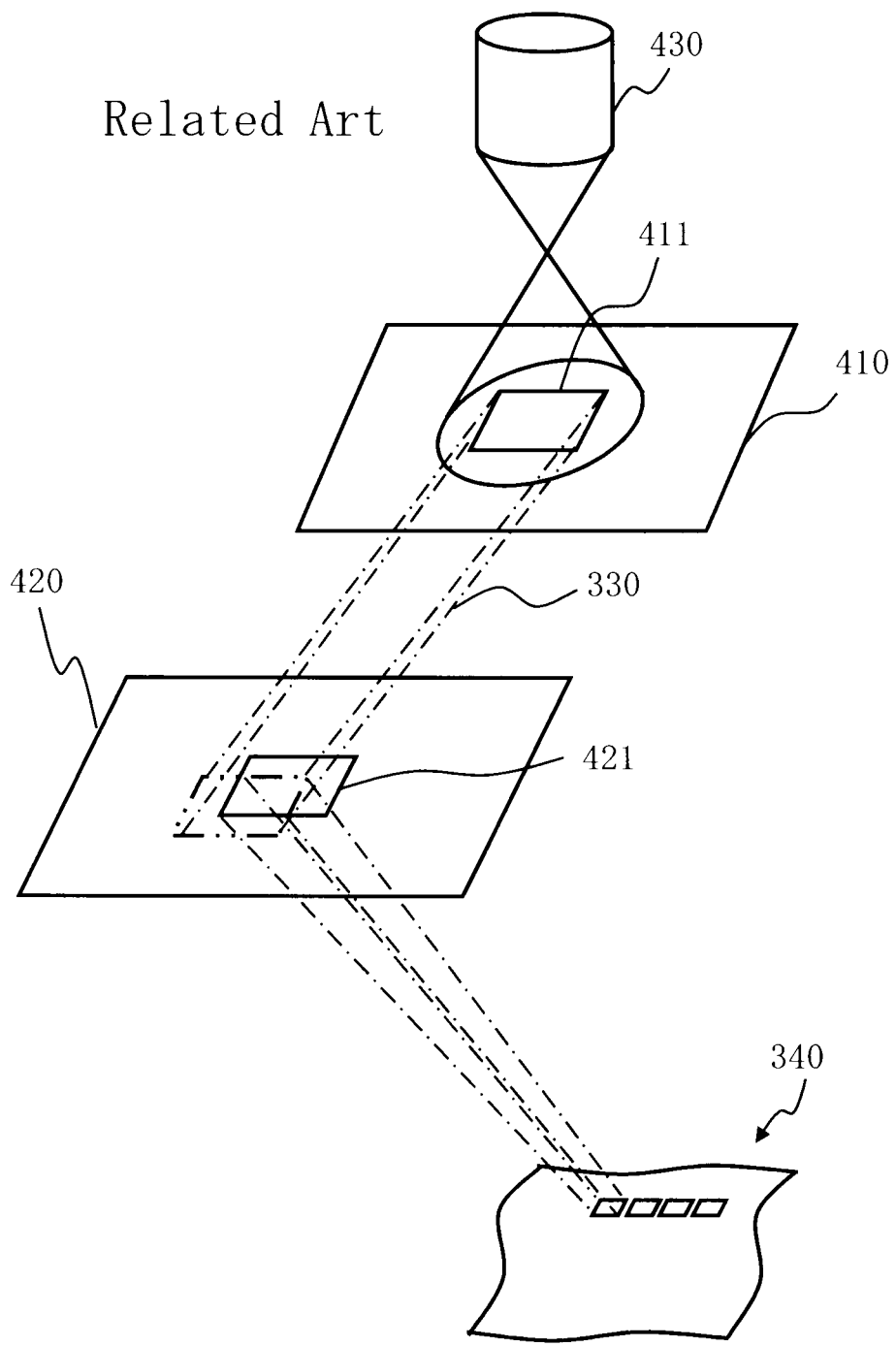
FIG. 15 shows a schematic diagram for explaining operations of a variable-shaped electron beam writing apparatus.

The high/low contrast described above affects the accuracy of the critical dimension of the figure. FIGS. 14A and 14B show the effect on the pattern resolution positions on the resists by the contrast of the dose. The threshold value Eth of a dose required for resist pattern resolution has a range, for example, from $+\Delta E$ to $-\Delta E$, depending upon the state of the resist at the time of writing, and accuracy of the EB apparatus and a resolution process. Therefore, when the dose contrast near the threshold value is low, the region for the dose to be from $+\Delta E$ to $\Delta E$ becomes wide, and then, as shown in FIG. 14A described for the conventional method, the position of the edge of a resolved pattern has the range of $\Delta \times 1$ to the maximum. On the other hand, if the dose contrast is high, even when the threshold value Eth has the range of from $+\Delta E$ to $-\Delta E$, it is possible to make the region be within the range of $\Delta \times 2$ which is smaller than $\Delta \times 1$, as shown in FIG. 14B described for each Embodiment. This is because, as described in each Embodiment, the dose contrast at the edge of the pattern 513 is increased by making the dose $D_B$ at the inner part of the region of the figure pattern less than the dose $D_A$ calculated by the conventional method.

Referring to specific examples, Embodiments have been described above. However, the present invention is not limited to these examples.

While the apparatus structure, control method, etc. not directly necessary for explaining the present invention are not described, some or all of them may be suitably selected and used when needed. For example, although description of the structure of a control unit for controlling the writing apparatus 100 is omitted, it should be understood that some or all of the structure of the control unit is to be selected and used appropriately.

In addition, any other charged particle beam writing apparatus and method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A beam writing apparatus comprising:
a memory configured to store a plurality of dose equations for calculating a dose of a beam;
a selection unit configured to select a dose equation from the plurality of dose equations stored in the memory, for each small region of a plurality of small regions made by virtually dividing a writing region of a target workpiece into mesh-like regions;
a dose calculation unit configured to calculate a dose of a beam which is shot into a small region of the plurality of small regions, by using a selected dose equation, for the each small region; and
a writing unit configured to write a desired pattern in the small region, by using a calculated dose, for the each small region,
wherein the selection unit selectively selects (1) one of the dose equations in a case that a pattern area density of the small region is 100% and each of pattern area densities of all of a plurality of small regions which adjacently surround the small region is 100%, and (2) another one of the dose equations in a case that a pattern area density of the small region is 100% and at least one of pattern area densities of the plurality of small regions which adjacently surround the small region is not 100%.

2. The apparatus according to claim 1, wherein a dose which is calculated based on one of the dose equations selected according to (1) is less than a dose which is calculated based on other one of the dose equations selected according to (2).

3. The apparatus according to claim 2, wherein a mesh size of the small region is larger than an influence radius of forward scattering of the beam.

4. The apparatus according to claim 1, wherein, as the beam, one of a charged particle beam and a laser beam is used.

5. A beam writing apparatus, comprising:
a memory configured to store a plurality of dose equations for calculating a dose of a beam;
a selection unit configured to select a dose equation from the plurality of dose equations stored in the memory, for each small region of a plurality of small regions made by virtually dividing a writing region of a target workpiece into mesh-like regions;
a dose calculation unit configured to calculate a dose of a beam which is shot into a small region of the plurality of small regions, by using a selected dose equation, for the each small region; and
a writing unit configured to write a desired pattern in the small region, by using a calculated dose, for the each small region,
wherein the selection unit selectively selects (1) one of the dose equations in a first condition that a bilinear area distribution value of a vertex of the small region is 100% and each of pattern area densities of four small regions which adjacently surround the vertex of the small region is 100%, and (2) another one of the dose equations in a second condition other than the first condition.

6. The apparatus according to claim 5, wherein a dose which is calculated based on one of the dose equations selected according to the first condition is less than a dose which is calculated based on other one of the dose equations selected according to the second condition.

7. The apparatus according to claim 6, wherein a mesh size of the small region is larger than an influence radius of forward scattering of the beam.

8. A beam writing method comprising:
selecting a dose equation from a plurality of dose equations stored in a memory for calculating a dose of a beam, for each small region of a plurality of small regions made by virtually dividing a writing region of a target workpiece into mesh-like regions;
calculating a dose of a beam which is shot into a small region of the plurality of small regions, by using a selected dose equation, for the each small region; and
writing a desired pattern in the small region, by using a calculated dose, for the each small region,
wherein (1) one of the dose equations is selectively selected in a case that a pattern area density of the small region is 100% and each of pattern area densities of all of a plurality of small regions which adjacently surround the small region is 100%, and (2) another one of the dose equations is selectively selected in a case that a pattern area density of the small region is 100% and at least one of pattern area densities of the plurality of small regions which adjacently surround the small region is not 100%.

9. The method according to claim 8, wherein, as the beam, one of a charged particle beam and a laser beam is used.

10. A beam writing method comprising:
selecting a dose equation from a plurality of dose equations stored in a memory for calculating a dose of a beam, for each small region of a plurality of small regions made by virtually dividing a writing region of a target workpiece into mesh-like regions;
calculating a dose of a beam which is shot into a small region of the plurality of small regions, by using a selected dose equation, for the each small region; and
writing a desired pattern in the small region, by using a calculated dose, for the each small region,
wherein (1) one of the dose equations is selectively selected in a first condition that a bilinear area distribution value of a vertex of the small region is 100% and each of pattern area densities of four small regions which adjacently surround the vertex of the small region is 100%, and (2) another one of the dose equations is selectively selected in a second condition other than the first condition.

11. A non-transitory computer-readable recording medium storing computer executable instructions to be executed by a computer, and to perform operations comprising:

selecting a dose equation from a plurality of dose equations stored in a memory for calculating a dose of a beam, for each small region of a plurality of small regions made by virtually dividing a writing region of a target workpiece into mesh-like regions, and storing a selected dose equation in a storage device; and reading the selected dose equation from the storage device, calculating a dose of a beam which is shot into a small region of the plurality of small regions, by using the selected dose equation, and outputting a calculated dose, for the each small region, wherein (1) one of the dose equations in a case that a pattern area density of the small region is 100% and each of pattern area densities of all of a plurality of small regions which adjacently surround the small region is 100% is selectively selected, and (2) another one of the dose equations in a case that a pattern area density of the small region is 100% and at least one of pattern area densities of the plurality of small regions which adjacently surround the small region is not 100% is selectively selected.

* * * * *